GAIN CONTROL CIRCUIT FOR SEMICONDUCTOR AMPLIFIERS

Filed Dec. 7, 1953

Inventor:
Woo F. Chow
by Charles M. Hutchins
His Attorney.

United States Patent Office 2,898,411

Patented Aug. 4, 1959

2,898,411

GAIN CONTROL CIRCUIT FOR SEMICONDUCTOR AMPLIFIERS

Woo Foung Chow, Syracuse, N.Y., assignor to General Electric Company, a corporation of New York Application December 7, 1953, Serial No. 396,676

5 Claims. (Cl. 179—171)

This invention relates to feedback circuits, and more particularly, to such circuits for controlling the gain of semiconductor amplifiers.

Semiconductor amplifying devices, such as transistors, are well-known. These devices perform functions somewhat similar to vacuum tubes. However, since the basic theories of operation of vacuum tubes and transistors are different, circuits employing transistors and vacuum tubes are not consistently correlative.

Feedback circuits for controlling the gain of vacuum-tube amplifiers in accordance with the strength of the signal being amplified are well-known. Such circuits are employed in conjunction with vacuum tube amplifiers for many purposes, such as volume expansion and compression and automatic gain control. Such feedback circuits are also desirable in semiconductor amplifiers to perform the similar functions for which they are utilized in vacuum tube amplifiers. However, because of the above-mentioned differences between vacuum tubes and semiconductor devices, feedback circuits of the types employed with vacuum tubes are not successful when applied to semiconductor devices.

Accordingly, it is the principal object of the present invention to provide an amplifying circuit utilizing semiconductor devices as the active elements therein having improved gain control characteristics.

A more specific object of the present invention is to provide an improved automatic gain control circuit for a semiconductor amplifier.

The objects of the present invention may be realized through the provision of means to control the operating point of a semiconductor amplifying device in accordance with the strength of the signal being amplified.

The features of this invention which are believed to be novel are set forth with particularity in the appended claims. The invention itself, however, both as to its organization and method of operation, together with further objects and advantages thereof, may best be understood by reference to the following description when taken in connection with the accompanying drawing wherein:

Figure 1:
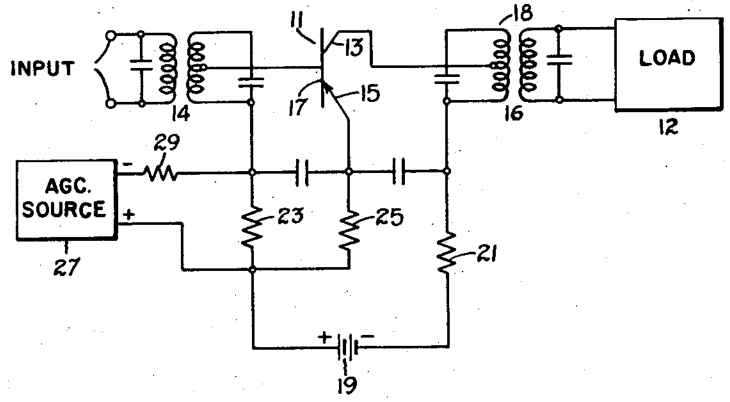
Fig. 1 is a schematic circuit diagram of an automatic gain control circuit embodying the principles of the present invention.

Referring now to Fig. 1, an automatic gain control circuit utilizing the principles of the present invention is therein illustrated. The gain control circuit comprises a semiconductor device 11 having collector, emitter, and base electrodes 13, 15 and 17, respectively. As schematically represented, the device 11 is a semiconductor device commonly denominated a junction transistor, and the preferred embodiment of the present invention is utilized in conjunction therewith. However, the invention is not restricted to junction transistors. For example, the present invention is applicable to circuits utilizing point-contact transistors and field-controlled semiconductor devices, among others.

Semiconductor device 11 is illustrated as being connected in an alternating current amplifying stage of the radio frequency type. An alternating current input signal is coupled through transformer 14 to the base-emitter circuit of transistor 11 so that the alternating current output signal appears across the primary winding 18, of coupling transformer 16, which is connected to the collector electrode 13. Coupling transformer 16 couples the alternating current output signal to a load 12.

Bias is supplied to the electrodes of the transistor 11 from a direct-voltage source 19. As is well-known, the collector electrode of a transistor is biased in the reverse direction, and the emitter electrode is biased in the forward direction, relative to the base electrode of the transistor where the terms "reverse direction" and "forward direction" are employed as they are normally used in the rectifier art.

As illustrated, the transistor 11 is conventionally represented as a P–N–P transistor. Therefore the negative terminal of the source 19 is connected, as by a resistor 21, to the collector electrode 13 to bias it in the reverse direction. However, as is well-known, an N–P–N transistor can be readily utilized instead of a P–N–P transistor, the only change necessary being a reversal of the terminals of the source 19. As will hereinafter appear, the resistor 21, besides coupling the source 19 to the collector 13, is important to the present invention.

In accordance with the present invention, the base 17 and emitter 15 are coupled to the positive terminal of the source 19, as by resistors 23 and 25, respectively. A source of automatic gain control voltage 27 is coupled, as by a resistor 29, across the base bias resistor 23 with a polarity as indicated. The output voltage of the source 27 is a direct voltage having a magnitude proportional to the strength of a signal being amplified by the transistor 11. The circuit for obtaining this automatic gain control signal is not a part of the present invention. Such a circuit is described and claimed in a copending application of A. P. Stern, Serial No. 400,855, filed December 29, 1953, now Patent No. 2,858,423, and assigned to the assignee of the present invention. This patent discloses a circuit in which the output signal of a gain controlled transistor stage, corresponding to that disclosed in the present application, is coupled to a detector circuit, and a detected direct current signal whose amplitude is a function of the amplitude of the output signal of the gain controlled stage, is supplied in a feedback circuit, to the gain controlled stage. As illustrated in Figure 1 of the present application, the gain controlled stage output signal is supplied to subsequent signal processing stages shown as load 12, and a portion of the subsequently detected signal is provided by the AGC source 27 as a direct current control signal which is returned to the gain controlled stage.

Figure 2:
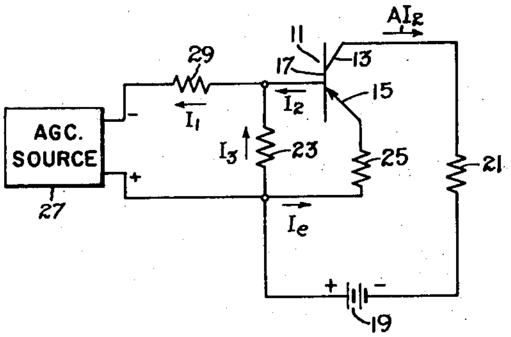
Fig. 2 is a D.-C. equivalent circuit diagram of the embodiment illustrated in Fig. 1.

The operation of the present invention is best understood with reference to Fig. 2, the D.-C. circuit diagram of the amplifier illustrated in Fig. 1. Like reference numerals designate corresponding circuit components in the two figures. The polarity of the AGC source 27 and the direct-voltage source 19 are as indicated, and the directions of the resulting currents in the various branches of the circuit are indicated by arrows identified by the letter I with subscripts.

The gain of a transistor amplifier is dependent on the operating point, which in turn is dependent on the independent variables of collector voltage and emitter current. Gain usually decreases with a decrease in collector voltage or with a decrease in emitter current. An increase in collector voltage or emitter current correspondingly causes an increase in gain. However, if the emitter current is increased and the collector voltage is decreased, a decrease in gain may result because collector voltage has a greater effect in gain than does emitter current at most common operating levels. Therefore, in accordance with the present invention, means are provided to control the operating point, and hence the gain, of the transistor 11.

In a preferred embodiment of the present invention, means are provided for controlling the collector voltage of the transistor 11 in accordance with the magnitude of a signal being amplified. The negative terminal of AGC circuit 27 is connected to the base 17 and the positive terminal thereof is connected to the emitter 15. Thus an increase in $I_1$, the AGC signal current, causes an increase in currents $I_e$, $I_2$ and $I_3$. $I_2$ is the effective controlling portion of $I_1$ because $I_2$ flows into the base 17 of the transistor 11. Due to the well-known properties of a grounded emitter stage, $I_2$ is amplified by the transistor 11 and appears at the collector 13 as $AI_2$ where A is the current amplification factor of the transistor 11 operated as a grounded emitter stage. The current $AI_2$ flows through the resistor 21 and causes an increased voltage drop thereacross. Since the potential of source 19 is fixed, an increased voltage drop across resistor 21 results in a decreased collector voltage, and as mentioned above, this decrease in collector voltage causes a decrease in gain.

Therefore, as the strength of the signal being amplified increases, the collector bias decreases, thereby counteracting the increase in signal, which is the desired result of an AGC circuit.

From the above description, it can be seen that the transistor 11 is utilized not only to perform its usual function, such as a radio-frequency or intermediate-frequency amplifier, but the transistor 11 is also utilized as a D.-C. amplifier for the AGC signal. Consequently, only a fraction of the control power which would otherwise be necessary is needed to provide control of the operating point.

Figure 3:
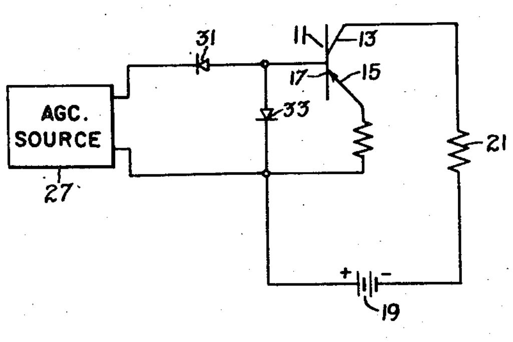
Fig. 3 is a schematic diagram of a modified form of automatic control circuit embodying the invention.

Fig. 3 is a D.-C. equivalent circuit diagram of an embodiment of the circuit illustrated in Fig. 1. The circuit differs over that illustrated in Figure 1 in that non-linear conducting devices, depicted as diodes 31 and 33, replace resistors 29 and 23, respectively, and are utilized to couple the AGC source 27 to the base 17. The diode 31 is connected with such a polarity that the normal D.-C. bias current of the transistor 11 is blocked and the passage of the AGC signal current is facilitated. This enables a lower voltage AGC source to be used than is necessary when the coupling resistor 29 is used.

The diode 33 is poled so that an increase in current flow increases the resistance of the element, i.e., it is poled to oppose the current $I_3$. Using the two diodes connected with the proper polarities, an AGC source having approximately one-half the voltage and one-fifth of the current capacity of an AGC circuit resistance coupled to the transistor 11 produces the same amount of control as the resistance-coupled AGC circuit.

The principles of the present invention can readily be utilized to provide a volume expansion or compression circuit. If such circuits are desired, the D.-C. signal to be applied across the resistor 23 is derived from the amplifier circuit in a manner so that it is proportional to the magnitude of the audio signal being amplified. If an expansion circuit is desired, this derived D.-C. signal is connected across the resistor 23 with a polarity such that an increase in audio signal magnitude causes an increase in collector voltage. If a compression circuit is desired, the derived D.-C. signal is connected across the resistor 23 with a polarity so that an increase in signal causes a decrease in collector bias.

While certain specific embodiments of the present invention have been shown and described, it will of course be understood, that various modifications may be devised by those skilled in the art which will embody the principles of the invention and found in the true spirit and scope thereof.

What is claimed is:

1. A circuit for controlling the gain of an alternating current transistor amplifier, said transistor having a base electrode, an emitter electrode and a collector electrode, a direct current source of energizing potential, an alternating current signal input circuit coupled between said base and emitter electrodes, an alternating current signal output circuit coupled between said collector and emitter electrodes, means for varying the gain of said amplifier so as to control the amplitude of the alternating current signal coupled to said alternating current signal output circuit and comprising, a gain control resistor, means coupling said gain control resistor and said source of energizing potential in series circuit between said collector and emitter electrodes for energization of said transistor, a source of variable direct current control signals varying inversely in amplitude to the desired gain of said amplifier, means coupling said control signal source between said base and emitter electrodes whereby an amplified direct current potential of said control signal is developed across said gain control resistor so as to provide alternating current amplification modifying changes in collector potential.

2. A circuit for controlling the gain of a transistor amplifier by controlling its operating point, said transistor having a base electrode, an emitter electrode and a collector electrode, a direct current source of energizing potential, an alternating current signal input circuit coupled between said base and emitter electrodes, an alternating current output circuit comprising, a load circuit, and reactance means for alternating current coupling said load circuit to said collector electrode, means for varying the gain of said amplifier by varying the bias applied to its collector electrode comprising a gain control resistor, means coupling said gain control resistor and said source of energizing potential in series circuit between said collector and emitter electrodes for energization of said transistor, a source of variable direct current control signals varying inversely in amplitude to the desired gain of said amplifier, means coupling said control signal source between said base and emitter electrodes whereby an amplified direct current potential of said control signal is developed across said gain control resistor so as to provide alternating current amplification modifying changes in collector potential.

3. A circuit for controlling the gain of a transistor amplifier by controlling its operating point, said transistor having a base electrode, an emitter electrode and a collector electrode, a direct current source of energizing potential, an alternating current signal input circuit coupled between said base and emitter electrodes; an alternating current signal output circuit comprising a load circuit, and reactance means for alternating current coupling said load circuit to said collector electrode, a gain control resistor, means coupling said reactance means, said gain control resistor and said direct current source in series circuit between said collector and emitter electrodes, means for varying the gain of said amplifier comprising a source of variable direct current control signals varying inversely in amplitude to the desired gain of said amplifier, means coupling said control signal source between said base and emitter electrodes whereby an amplified direct current potential of said control signal is developed across said gain control resistor so as to provide alternating current amplification modifying changes in collector potential.

4. The circuit of claim 1 in which said means coupling the control signal source between said base and emitter electrodes comprises diode means coupled in series between said control signal source and the emitter to base path of said transistor amplifier and poled in a direction to enable the passage of the control signal through said emitter to base path, said control signal source being connected with a polarity so that an increase in the magnitude of the control signal causes an increase in emitter current thereby to cause an increase in voltage drop across the gain control resistor.

5. The circuit of claim 1 in which said means coupling the control signal source between said base and emitter electrodes comprises first and second rectifying means, said first rectifying means being coupled in series between said control signal source and the emitter to base path of said transistor amplifier and poled in a direction to enable the passage of the control signal through said emitter to base path, said second rectifying means being coupled in parallel with said emitter to base path and poled in a direction to present a high impedance to the flow of current from said control signal source, said control signal source being connected with a polarity so that an increase in the magnitude of the control signal causes an increase in emitter current thereby to cause an increase in voltage drop across the gain control resistor.

References Cited in the file of this patent

UNITED STATES PATENTS

| | | |
|---|---|---|
| 2,369,066 | Maxwell | Feb. 6, 1945 |
| 2,544,211 | Barton | Mar. 6, 1951 |
| 2,644,914 | Kircher | July 7, 1953 |
| 2,662,122 | Ryder | Dec. 8, 1953 |
| 2,666,150 | Blakely | Jan. 12, 1954 |
| 2,675,433 | Pankove | Apr. 13, 1954 |
| 2,709,787 | Kircher | May 31, 1955 |
| 2,751,446 | Bopp | June 19, 1956 |
| 2,761,916 | Barton | Sept. 4, 1956 |
| 2,762,873 | Goodrich | Sept. 11, 1956 |
| 2,762,875 | Fischer | Sept. 11, 1956 |

OTHER REFERENCES

Bell text, "The Transistor," pages 402, 409, published 1951 by Bell Tel. Labs., Inc., Murray Hill, N.J.